US012727155B2

(12) United States Patent
Kim et al.

(10) Patent No.: US 12,727,155 B2
(45) Date of Patent: Sep. 1, 2026

(54) SEMICONDUCTOR DEVICE

(71) Applicant: Samsung Electronics Co., Ltd., Suwon-si (KR)

(72) Inventors: Sungeun Kim, Suwon-si (KR); Jinyeong Kim, Suwon-si (KR); Sungyeon Ryu, Suwon-si (KR); Hyeonok Jung, Suwon-si (KR); Sei-Ryung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 393 days.

(21) Appl. No.: 18/462,677

(22) Filed: Sep. 7, 2023

(65) Prior Publication Data

US 2024/0284664 A1 Aug. 22, 2024

(30) Foreign Application Priority Data

Feb. 22, 2023 (KR) ........................ 10-2023-0023512

(51) Int. Cl.
*H10B 12/00* (2023.01)

(52) U.S. Cl.
CPC ........... *H10B 12/50* (2023.02); *H10B 12/315* (2023.02); *H10B 12/482* (2023.02); *H10B 12/488* (2023.02)

(58) Field of Classification Search
CPC .... H10B 12/00; H10B 12/0383; H10B 12/50; H10B 12/053; H10B 12/09; H10B 12/315; H10B 12/34; H10B 12/482; H10B 12/488; H10B 61/00; H10B 63/10; H01L 21/0217; H01L 21/02; H01L 21/02164; H01L 21/762; H01L 21/76229; H10D 62/10; H10D 62/113; H10P 14/692; H10P 14/69215; H10P 14/694; H10P 14/69433; H10W 10/0143
See application file for complete search history.

(56) References Cited

U.S. PATENT DOCUMENTS

| | | | |
|---|---|---|---|
| 7,709,927 | B2 | 5/2010 | Shin et al. |
| 8,012,847 | B2 | 9/2011 | Patraw et al. |
| 8,697,579 | B2 | 4/2014 | Park et al. |
| 8,786,047 | B2 | 7/2014 | Kim et al. |
| 8,809,993 | B2 | 8/2014 | Kwak et al. |
| 9,564,352 | B2 | 2/2017 | Kim et al. |

(Continued)

FOREIGN PATENT DOCUMENTS

KR 100843246 B1 7/2008

*Primary Examiner* — Brook Kebede
(74) *Attorney, Agent, or Firm* — Wolf, Greenfield & Sacks, P.C.

(57) ABSTRACT

A semiconductor device includes peripheral active patterns on a substrate, first and second peripheral trench regions adjacent the peripheral active patterns, a first isolation liner on inner surfaces of the first and second peripheral trench regions, a second isolation liner on the first isolation liner in the first and second peripheral trench regions, and a device isolation layer on the second isolation liner in the first and second peripheral trench regions. The device isolation layer includes a seam therein in the second peripheral trench region. A width of the first peripheral trench region is greater than a width of the second peripheral trench region at a first height corresponding to top surfaces of the peripheral active patterns with respect to the substrate.

20 Claims, 17 Drawing Sheets

(56) References Cited

U.S. PATENT DOCUMENTS

| | | | | |
|---|---|---|---|---|
| 11,133,320 | B2 | 9/2021 | Chen et al. | |
| 2004/0241956 | A1* | 12/2004 | Eun | H01L 21/76224 257/E21.546 |
| 2015/0162237 | A1* | 6/2015 | Kim | H01L 21/0223 438/435 |
| 2018/0350905 | A1* | 12/2018 | Yoon | H01L 21/76232 |
| 2019/0221669 | A1* | 7/2019 | Lee | H10B 12/0385 |
| 2019/0355728 | A1* | 11/2019 | Kim | H10B 12/033 |
| 2022/0359311 | A1 | 11/2022 | Chen et al. | |

* cited by examiner

FIG. 3A

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2023-0023512, filed on Feb. 22, 2023, in the Korean Intellectual Property Office, the entire contents of which are hereby incorporated by reference.

BACKGROUND

The present disclosure relates to a semiconductor device, and more particularly, to a semiconductor device including a device isolation pattern.

Semiconductor devices are widely used in an electronic industry because of their small sizes, multi-functional characteristics, and/or low manufacturing costs. Semiconductor devices may be categorized as any one of semiconductor memory devices for storing logical data, semiconductor logic devices for processing logical data, and hybrid semiconductor devices having both the function of the semiconductor memory devices and the function of the semiconductor logic devices.

High-speed and low-voltage semiconductor devices have been demanded to satisfy characteristics (e.g., high speed and/or low power consumption) of electronic devices including semiconductor devices. Semiconductor devices have been highly integrated to meet these demands. Process failure in processes of manufacturing semiconductor devices may increase as integration densities of the semiconductor devices increase. Thus, techniques for reducing process failure of semiconductor devices have been variously studied.

SUMMARY

Embodiments of the inventive concepts may provide a semiconductor device capable of reducing process failure.

In some embodiments, a semiconductor device may include peripheral active patterns on a substrate, a first peripheral trench region and a second peripheral trench region which are adjacent the peripheral active patterns, a first isolation liner on inner surfaces of the first and second peripheral trench regions, a second isolation liner on the first isolation liner in the first and second peripheral trench regions, and a device isolation layer on the second isolation liner in the first and second peripheral trench regions. The device isolation layer may include a seam therein in the second peripheral trench region. A width of the first peripheral trench region may be greater than a width of the second peripheral trench region at a first height corresponding to top surfaces of the peripheral active patterns with respect to the substrate.

In some embodiments, a semiconductor device may include peripheral active patterns on a substrate, a first peripheral trench region and a second peripheral trench region adjacent the peripheral active patterns, a first isolation liner on inner surfaces of the first and second peripheral trench regions, a second isolation liner on the first isolation liner in the first and second peripheral trench regions, a first device isolation layer on the second isolation liner in the first peripheral trench region and in the second peripheral trench region, and a second device isolation layer filling the first peripheral trench region.

In some embodiments, a semiconductor device may include a substrate including a cell region and a peripheral region, a cell active pattern on the cell region, the cell active pattern including a center portion and an edge portion, a word line intersecting the cell active pattern, a bit line on the center portion of the cell active pattern and that extends in a direction intersecting the word line, a storage node contact on the edge portion of the cell active pattern, a landing pad on the storage node contact, a data storage pattern on the landing pad, peripheral active patterns on the peripheral region, peripheral word lines on the peripheral active patterns, a first peripheral trench region and a second peripheral trench region adjacent the peripheral active patterns, a first isolation liner on inner surfaces of the first and second peripheral trench regions, a second isolation liner on the first isolation liner in the first and second peripheral trench regions, and a device isolation layer on the second isolation liner in the first and second peripheral trench regions. The device isolation layer may include a seam therein in the second peripheral trench region. A width of the first peripheral trench region may be greater than a width of the second peripheral trench region at a first height corresponding to top surfaces of the peripheral active patterns with respect to the substrate.

BRIEF DESCRIPTION OF THE DRAWINGS

FIG. 3A is a cross-sectional view corresponding to lines A-A', B-B' and C-C' of FIG. 2.

DETAILED DESCRIPTION

Embodiments of the inventive concepts will now be described more fully with reference to the accompanying drawings.

Figure 1:
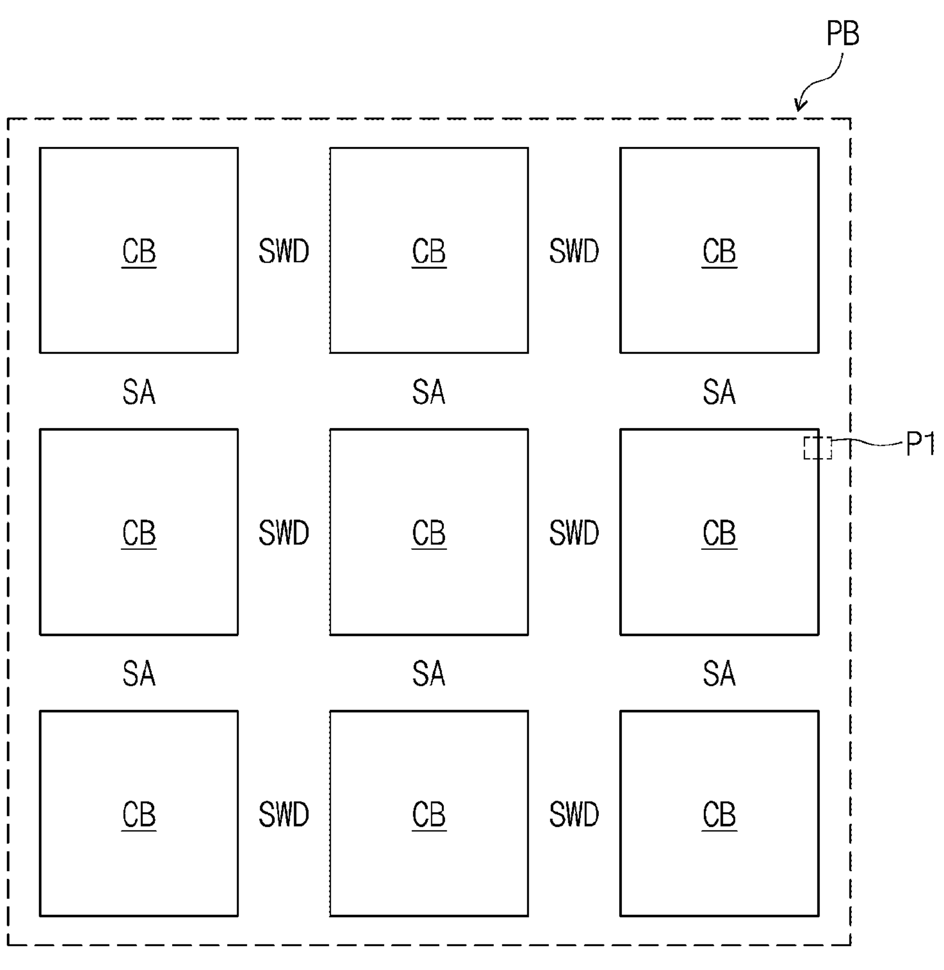
FIG. 1 is a block diagram illustrating a semiconductor device according to some embodiments of the inventive concepts.

FIG. 1 is a block diagram illustrating a semiconductor device according to some embodiments of the inventive concepts.

Referring to FIG. 1, a semiconductor device may include cell blocks CB and a peripheral block PB surrounding each of the cell blocks CB. Each of the cell blocks CB may include a cell circuit such as a memory integrated circuit. The peripheral block PB may include various peripheral circuits used for operating the cell circuit, and the peripheral circuits may be electrically connected to the cell circuit.

The peripheral block PB may include sense amplifier circuits SA and sub-word line driver circuits SWD. For example, the sense amplifier circuits SA may face each other with the cell block CB interposed therebetween, and the sub-word line driver circuits SWD may face each other with the cell block CB interposed therebetween. The peripheral block PB may further include power and ground driver circuits for driving the sense amplifier, but embodiments of the inventive concepts are not limited thereto.

Figure 2:
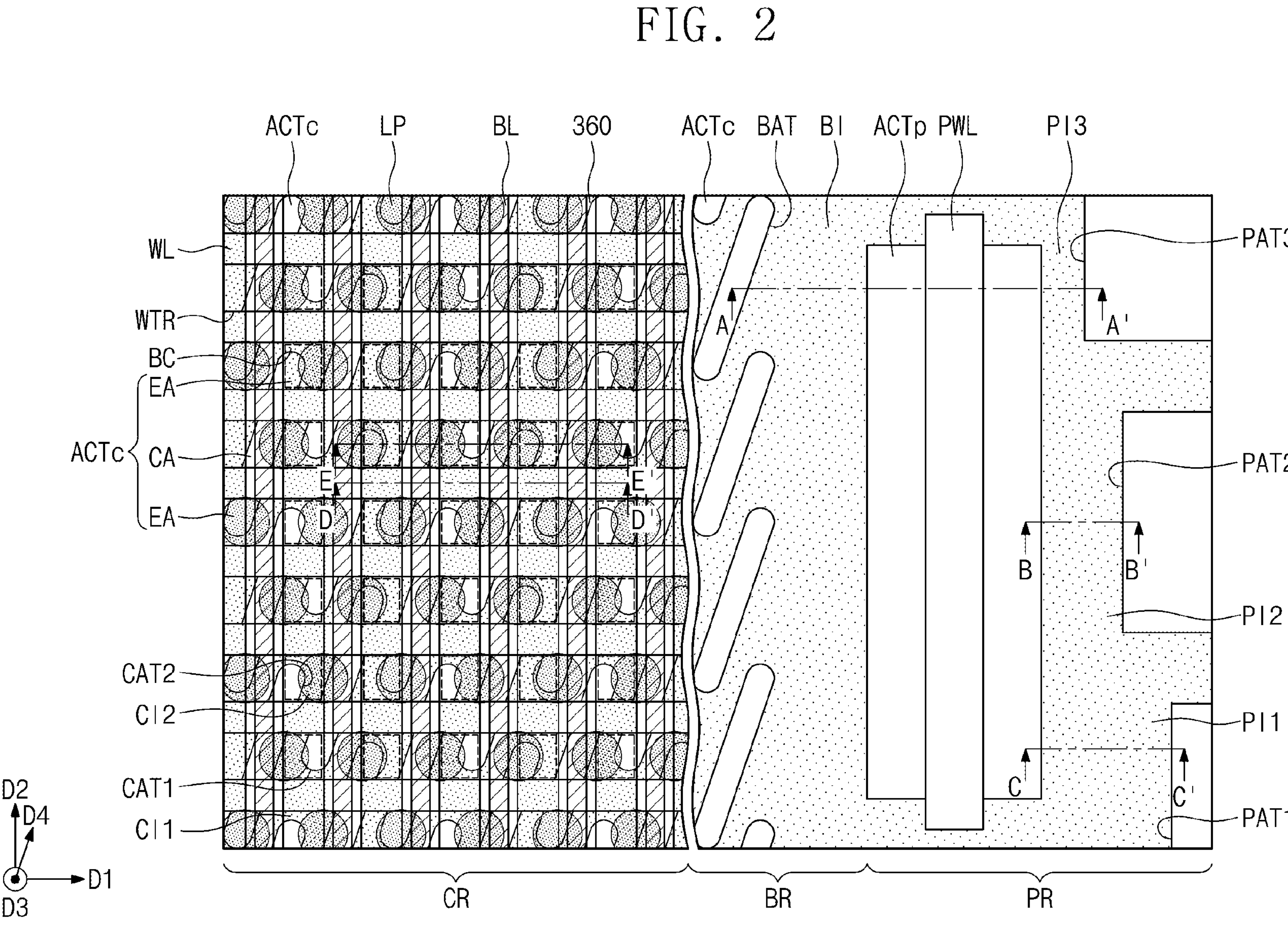
FIG. 2 is an enlarged plan view corresponding to a portion 'P1' of FIG. 1 to illustrate a semiconductor device according to some embodiments of the inventive concepts.
Figure 3A:
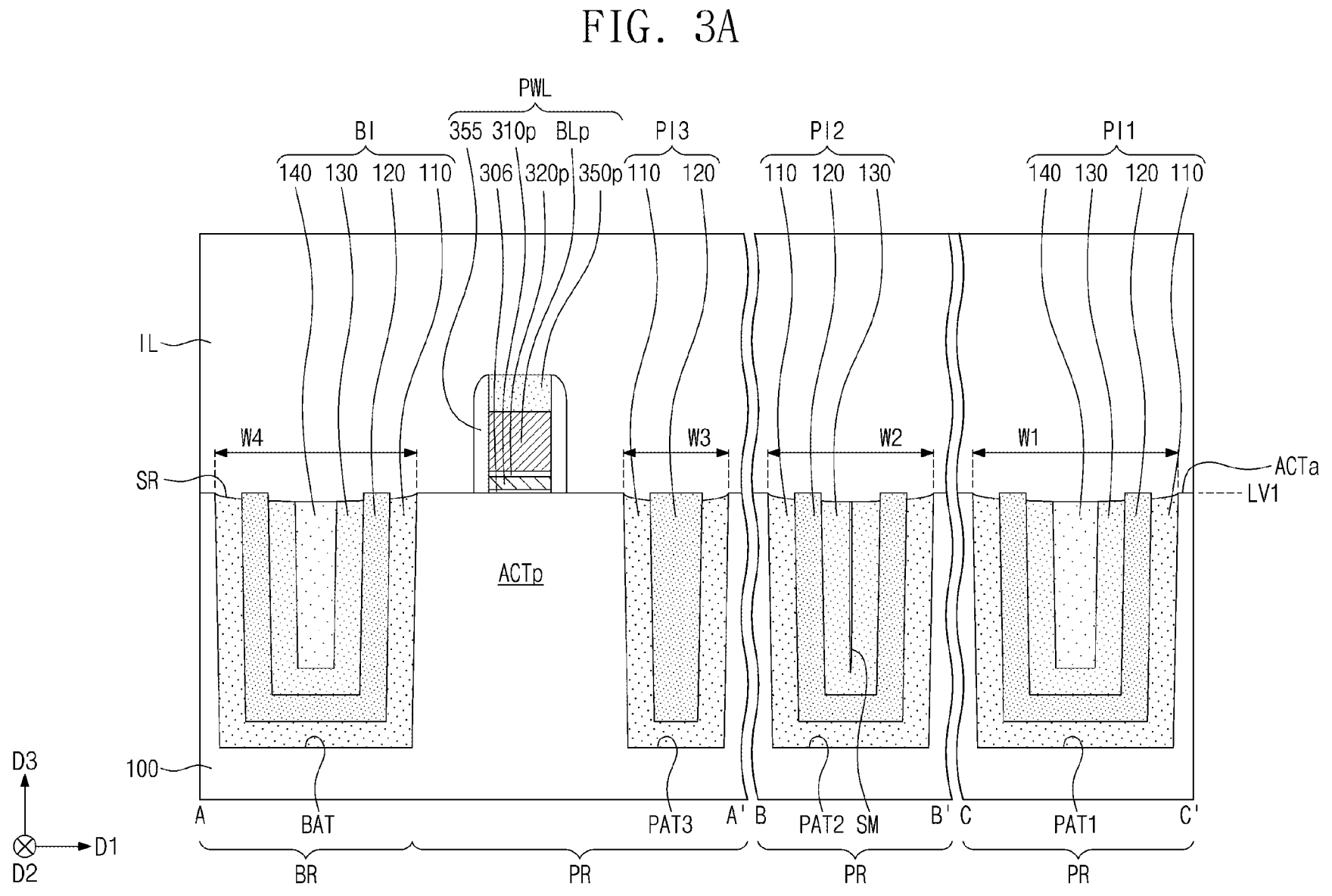
Figure 3B:
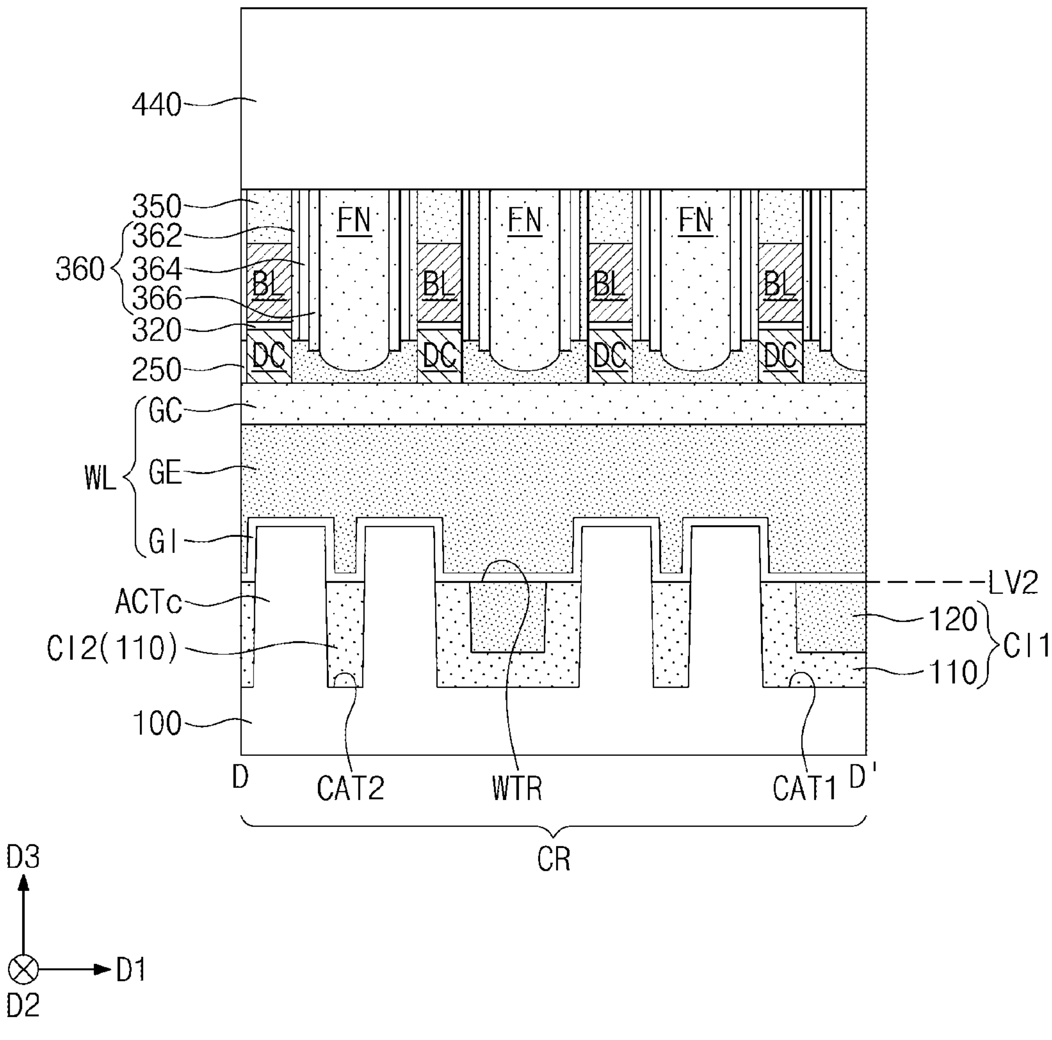
FIG. 3B is a cross-sectional view corresponding to a line D-D' of FIG. 2.
Figure 3C:
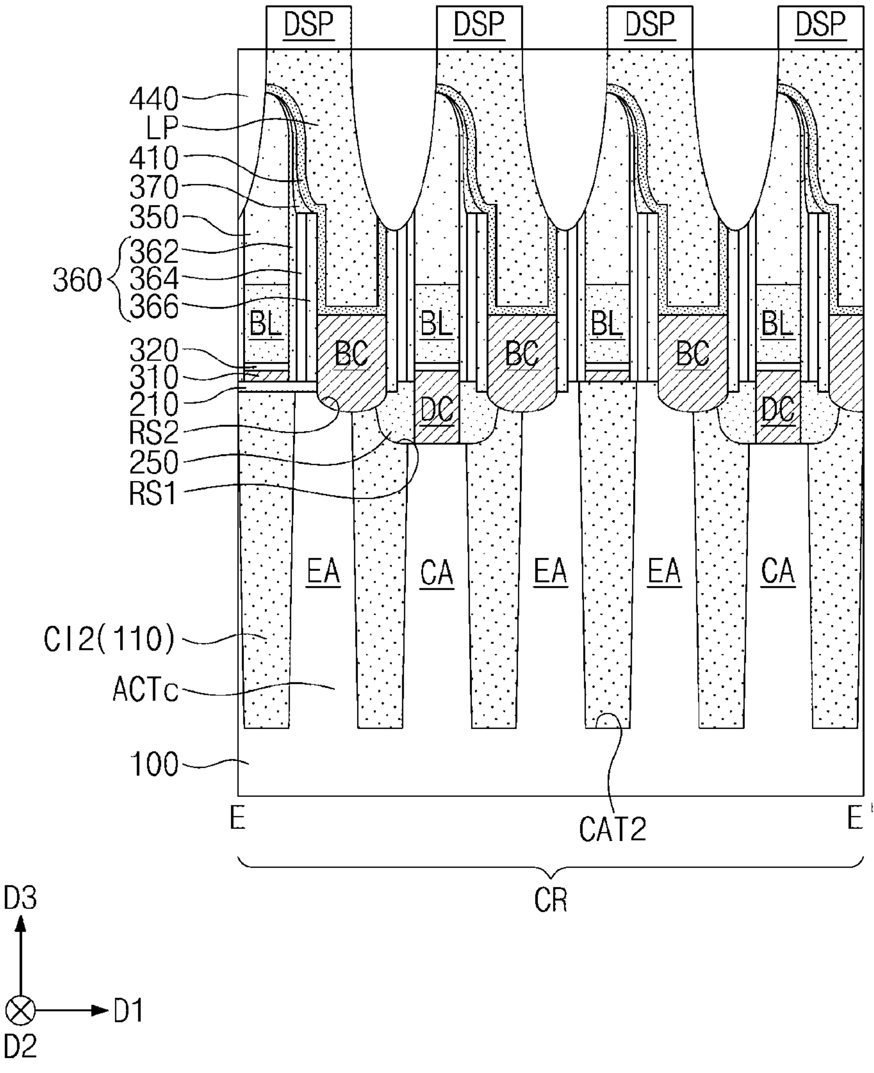
FIG. 3C is a cross-sectional view corresponding to a line E-E' of FIG. 2.
Figure 4A:
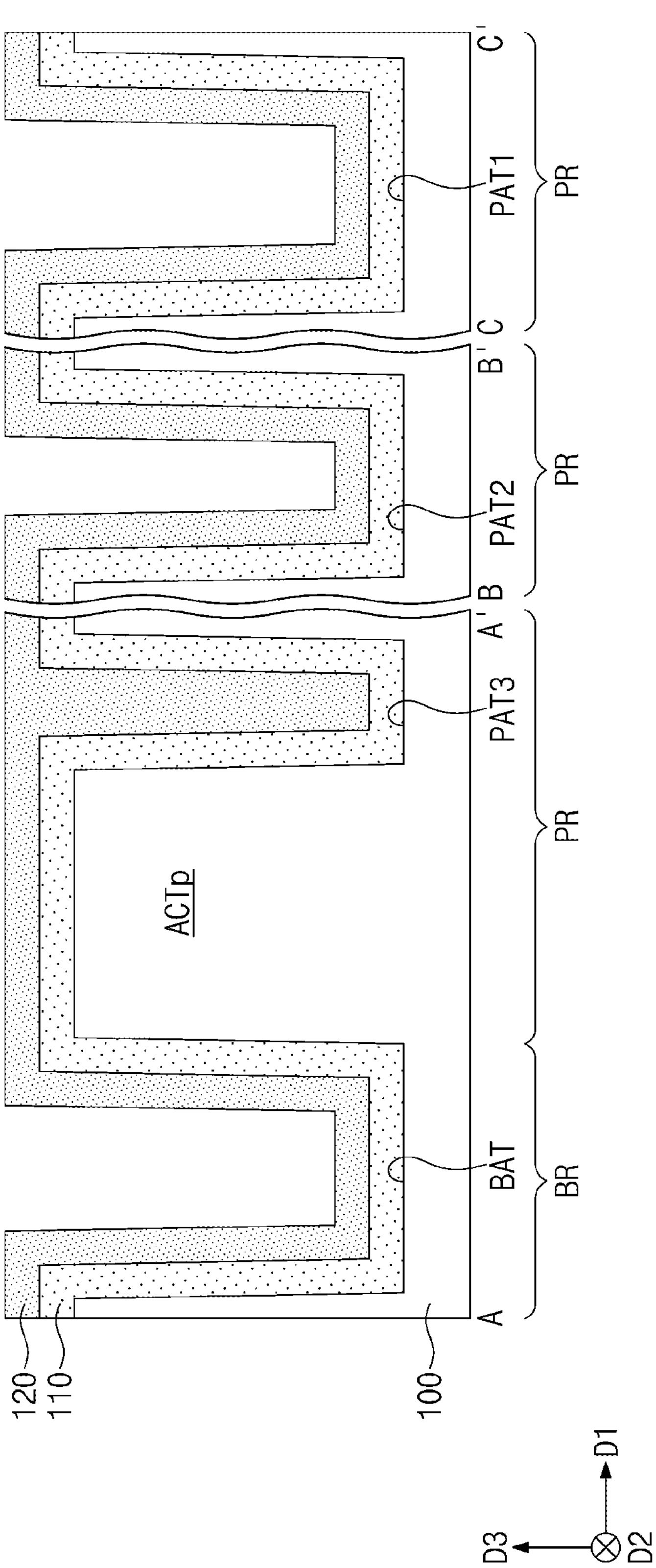
FIGS. 4A, 4B, 4C, 5A, 5B, 5C, 6A, 6B, 6C, 7A, 7B, and 7C are cross-sectional views illustrating a method of manufacturing a semiconductor device according to some embodiments of the inventive concepts.
Figure 4B:
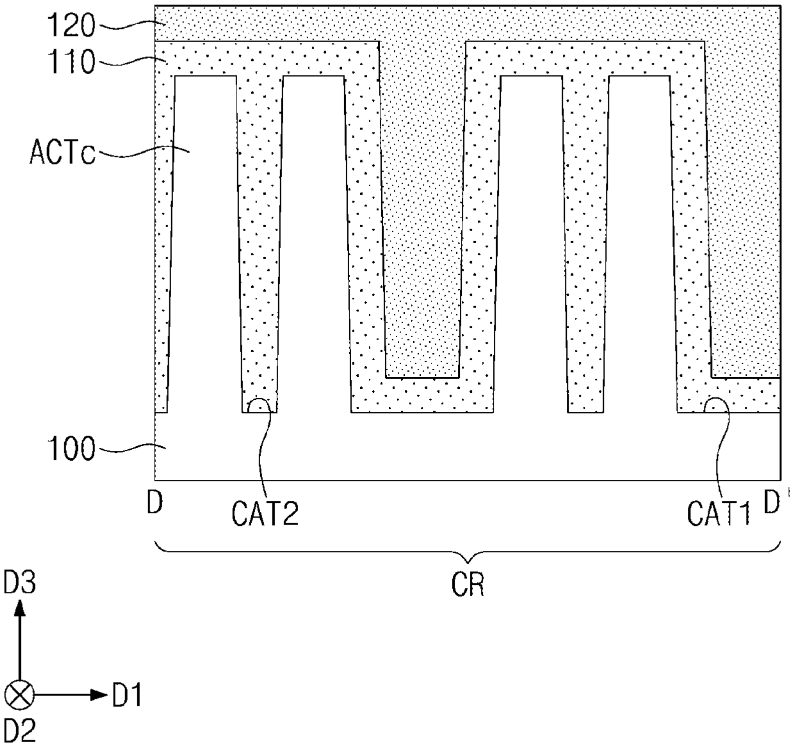
Figure 4C:
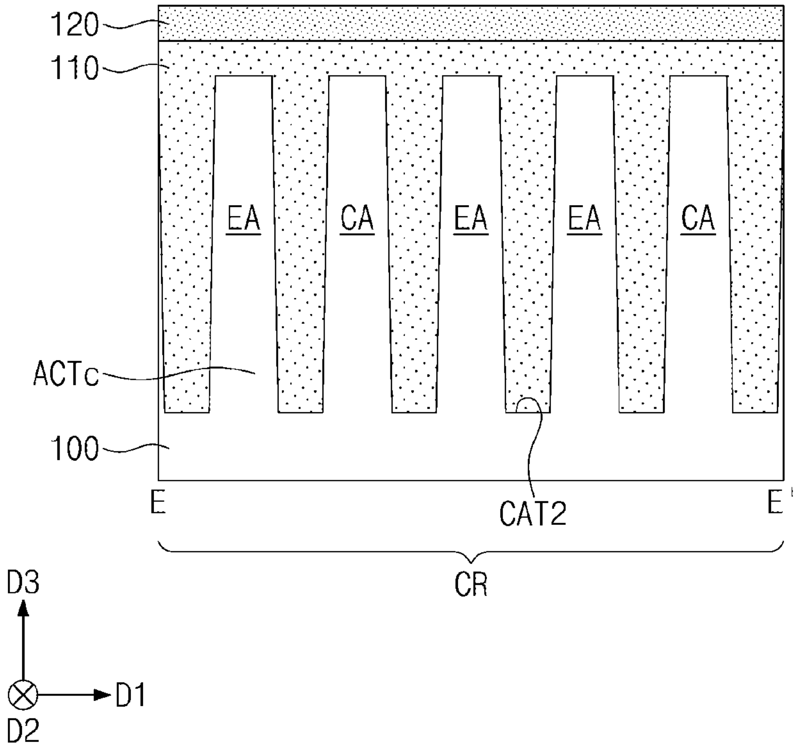
Figure 5A:
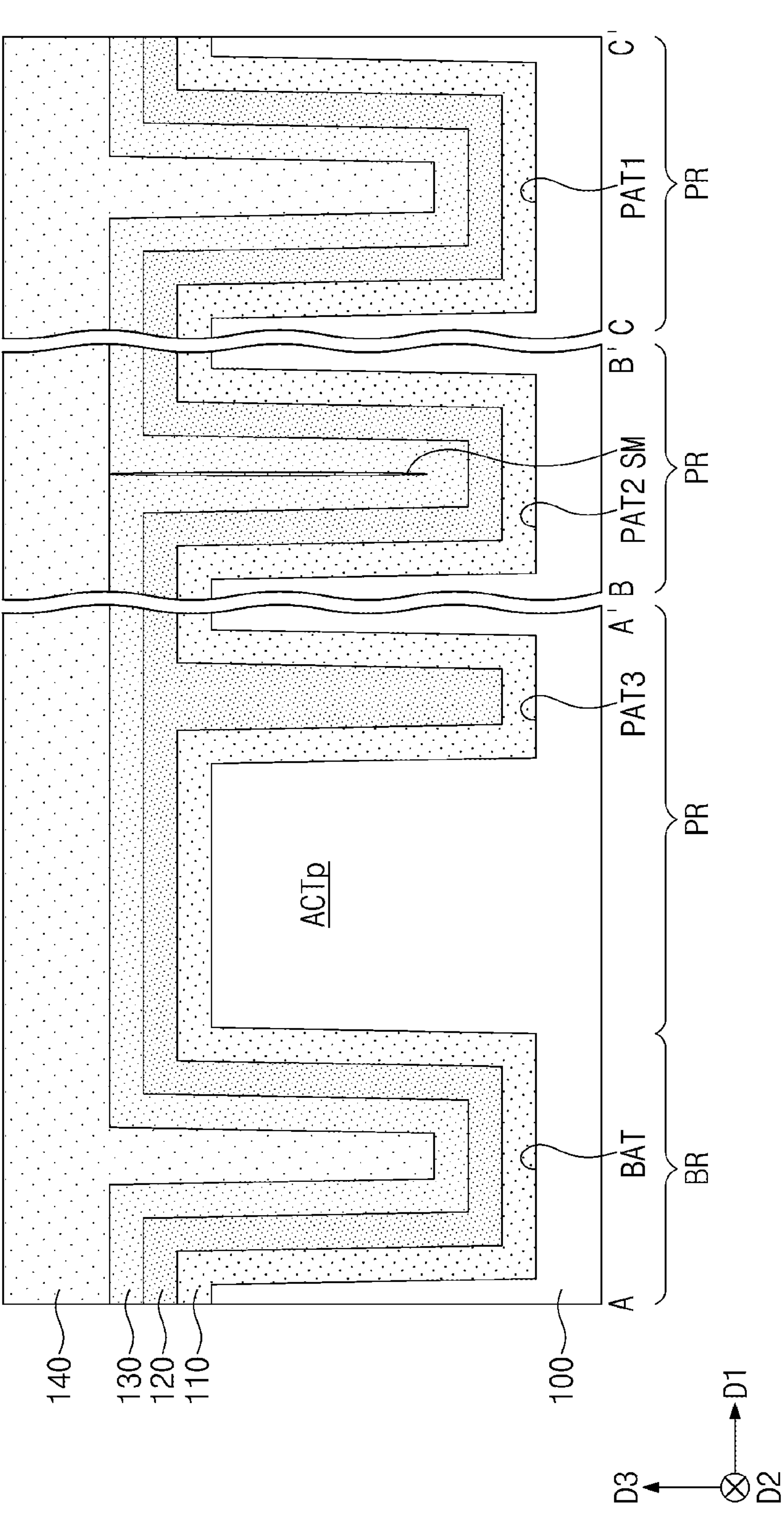
Figure 5B:
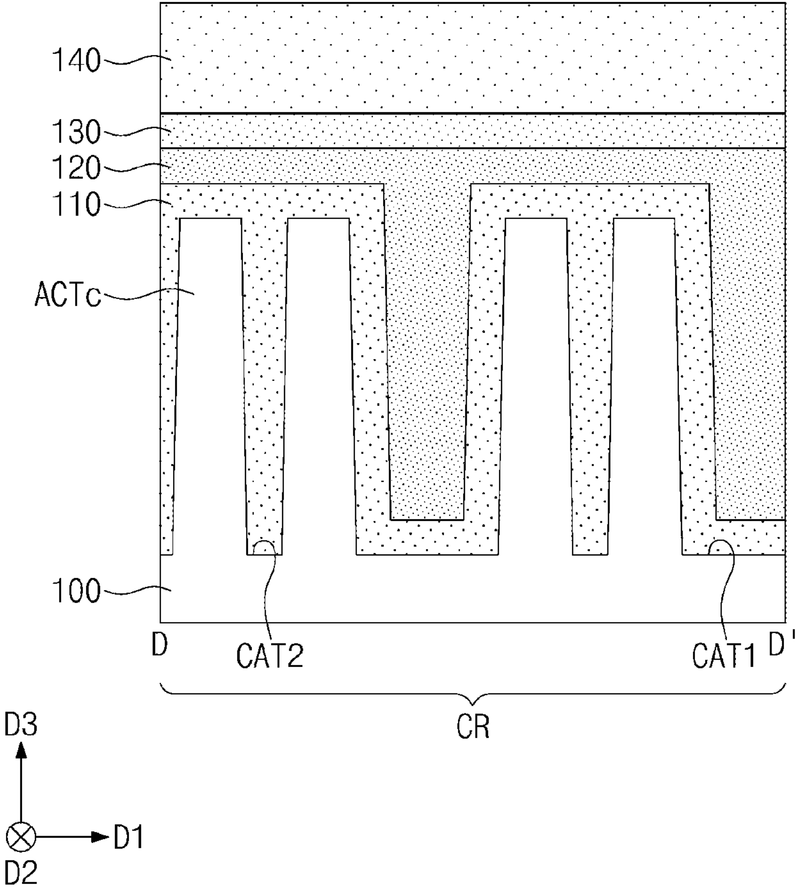
Figure 5C:
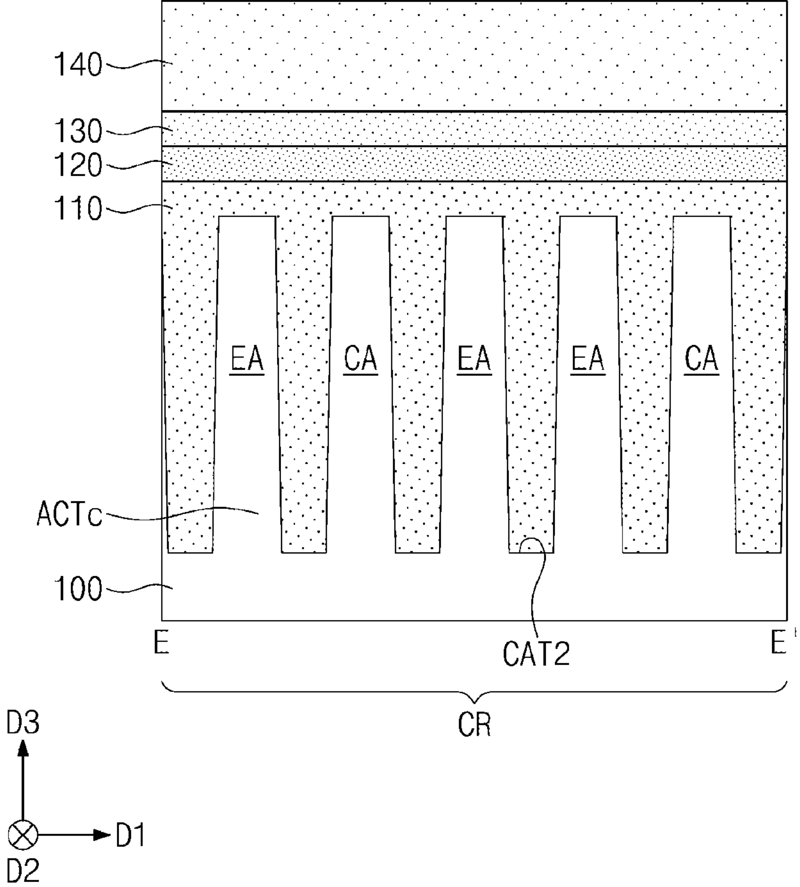
Figure 6A:
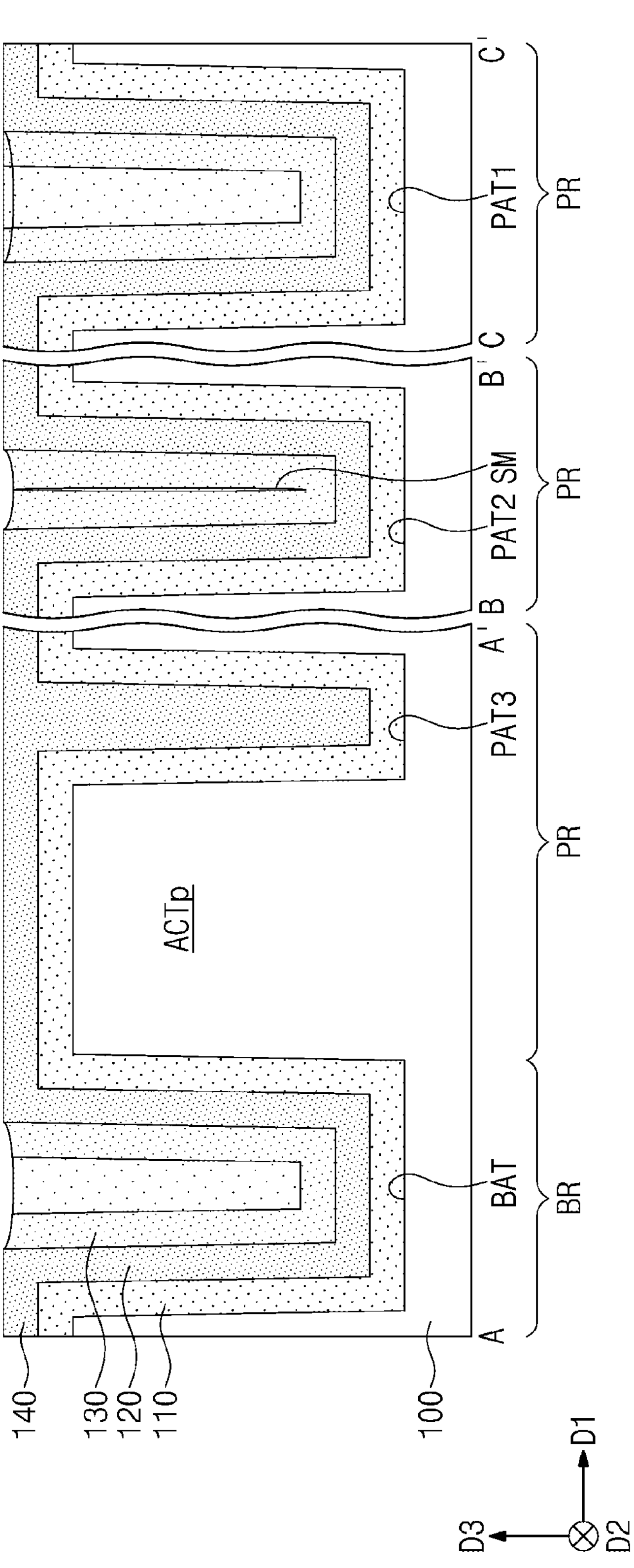
Figure 6B:
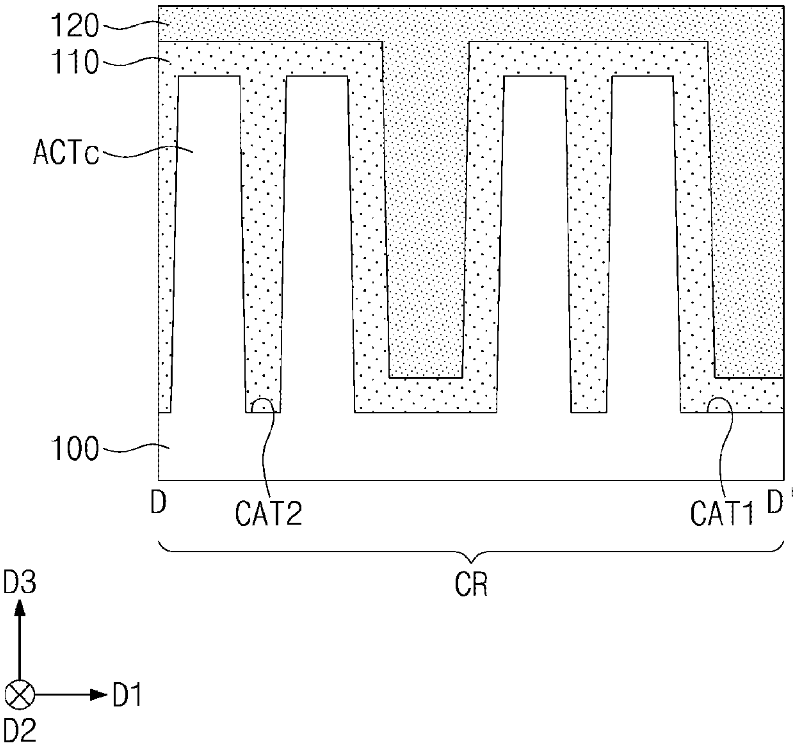
Figure 6C:
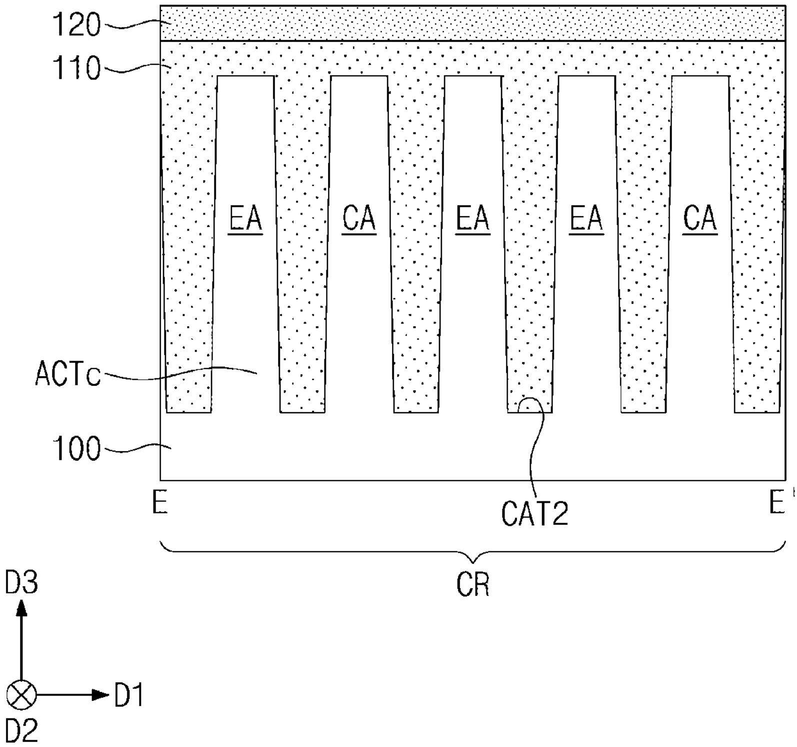
Figure 7A:
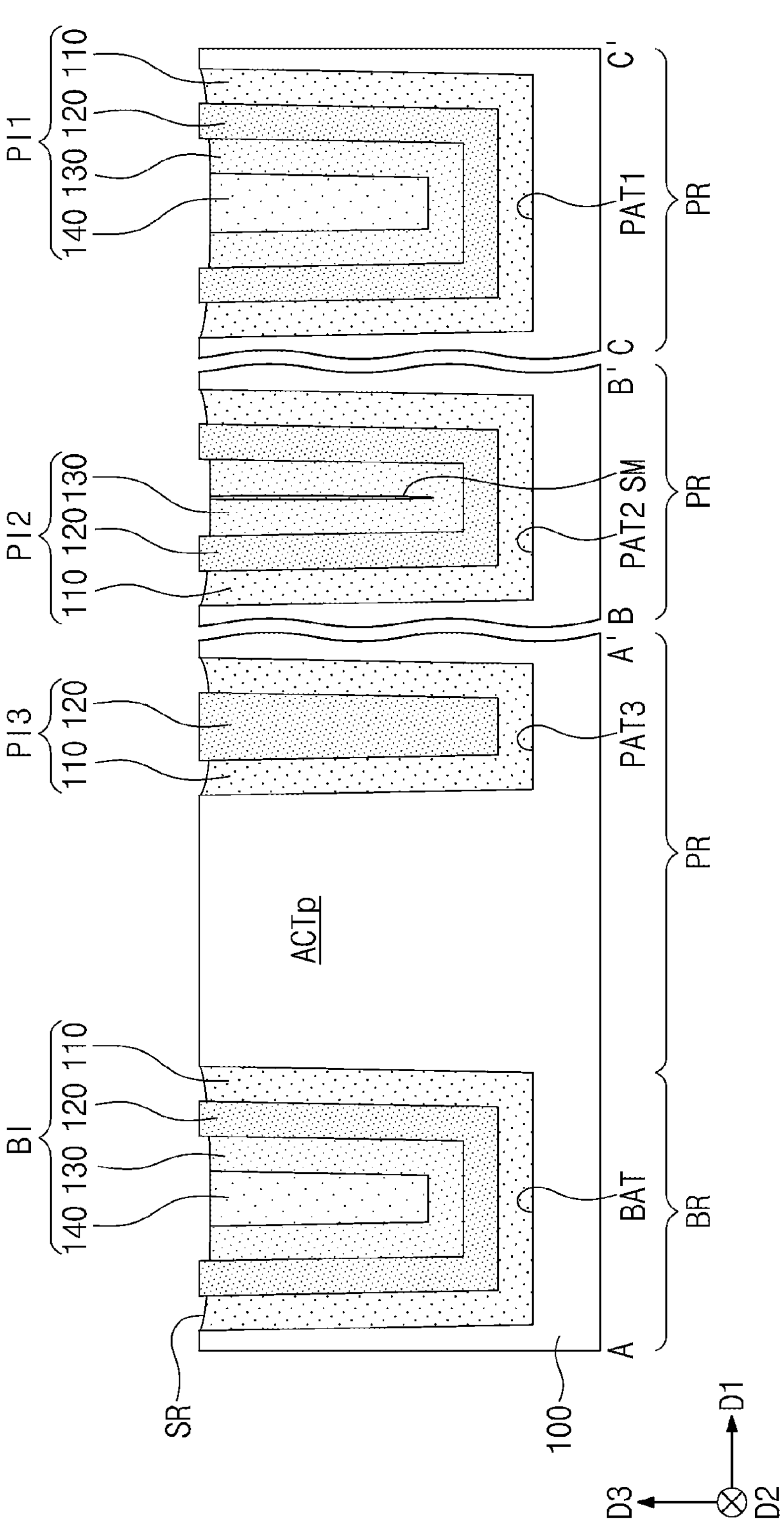
Figure 7B:
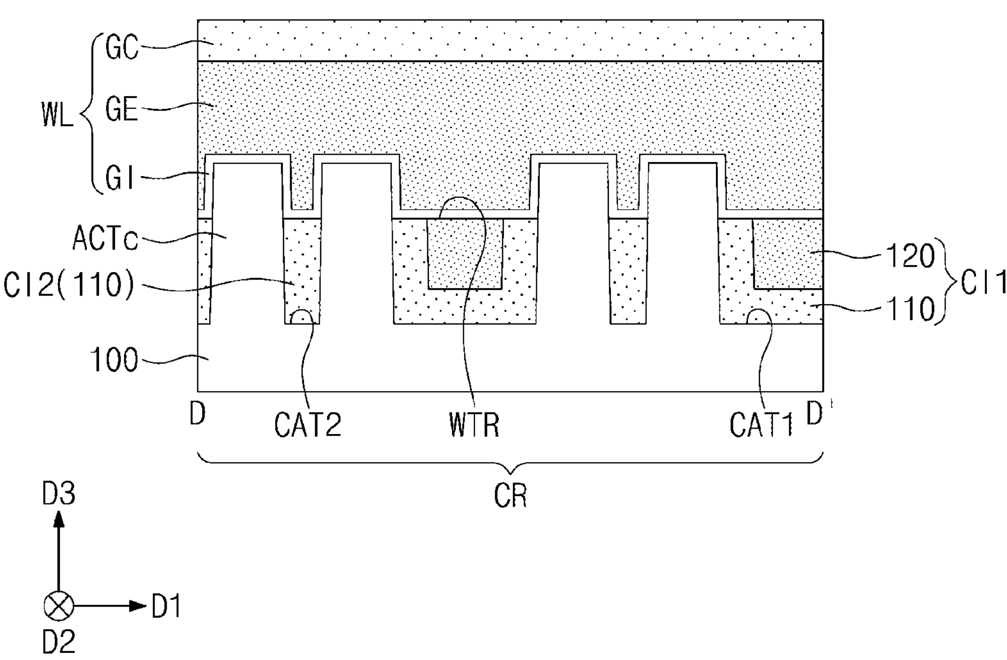
Figure 7C:
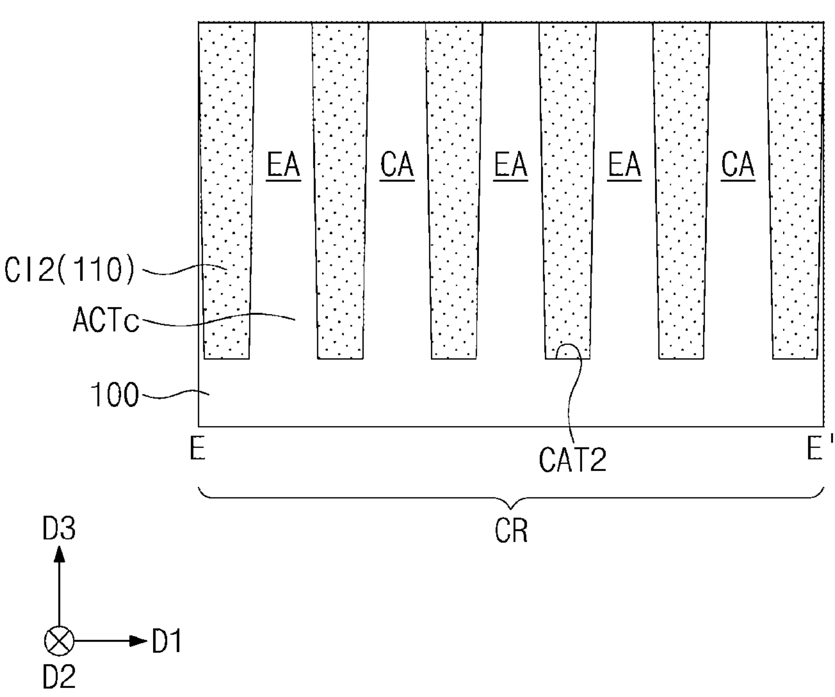

FIG. 2 is an enlarged plan view corresponding to a portion 'P1' of FIG. 1 to illustrate a semiconductor device according to some embodiments of the inventive concepts. FIG. 3A is a cross-sectional view corresponding to lines A-A', B-B' and C-C' of FIG. 2. FIG. 3B is a cross-sectional view corresponding to a line D-D' of FIG. 2. FIG. 3C is a cross-sectional view corresponding to a line E-E' of FIG. 2.

Referring to FIGS. 2, 3A, 3B, and 3C, a substrate 100 may be provided. For example, the substrate 100 may include a cell region CR, a peripheral region PR, and a boundary region BR between the cell region CR and the peripheral region PR. The cell region CR may be a region of the substrate 100, on which the cell blocks CB of FIG. 1 are provided. The peripheral region PR may be another region of the substrate 100, on which the peripheral block PB of FIG. 1 is provided. The boundary region BR may be still another region of the substrate 100, which is provided between the cell block CB and the peripheral block PB of FIG. 1.

A device isolation pattern may be located in the substrate 100. For example, the device isolation pattern may be located in a trench region provided in the substrate 100. The device isolation pattern may include a cell device isolation pattern CI1 and CI2 on the cell region CR, a peripheral device isolation pattern PI1, PI2 and PI3 on the peripheral region PR, and a boundary device isolation pattern BI on the boundary region BR. The cell device isolation pattern CI1 and CI2 may be located in a cell trench region CAT1 and CAT2 defining cell active patterns ACTc on the cell region CR. The peripheral device isolation pattern PI1, PI2 and PI3 may be located in a peripheral trench region PAT1, PAT2 and PAT3 defining peripheral active patterns ACTp on the peripheral region PR. The boundary device isolation pattern BI may be located in a boundary trench region BAT between the cell active patterns ACTc and the peripheral active patterns ACTp on the boundary region BR. For example, the cell active patterns ACTc on the boundary region BR may be dummy cell active patterns, but embodiments of the inventive concepts are not limited thereto.

The cell active patterns ACTc and the peripheral active patterns ACTp may include portions of the substrate 100, which are surrounded by the device isolation pattern. In the present specification, the substrate 100 may be defined as another portion of the substrate 100 except the portions (i.e., the cell active patterns ACTc and the peripheral active patterns ACTp) unless otherwise stated, for the purpose of ease and convenience in explanation.

The cell active patterns ACTc may be spaced apart from each other in a first direction D1 and a second direction D2. The first direction D1 and the second direction D2 may be parallel to a bottom surface of the substrate 100 and may intersect (e.g., be perpendicular to) each other. The cell active patterns ACTc and the peripheral active patterns ACTp may have shapes protruding in a third direction D3 perpendicular to the bottom surface of the substrate 100. Each of the cell active patterns ACTc may have a long shape extending in a fourth direction D4 in a plan view.

Each of the cell active patterns ACTc may include a center portion CA and an edge portion EA. For example, each of the cell active patterns ACTc may include the center portion CA, and a pair of the edge portions EA spaced apart from each other in the fourth direction D4 with the center portion CA interposed therebetween. The pair of edge portions EA may be both end portions of the cell active pattern ACTc in the fourth direction D4. The center portion CA may be disposed between a pair of word lines WL (to be described later) intersecting the cell active pattern ACTc. Dopants (e.g., n-type or p-type dopants) may be provided in the center portion CA and the edge portion EA.

Each of the device isolation patterns may include at least one of a first isolation liner 110, a second isolation liner 120, a first device isolation layer 130, or a second device isolation layer 140. For example, the first isolation liner 110, the second isolation liner 120 and the first device isolation layer 130 may each independently include silicon oxide or silicon nitride. For example, the first isolation liner 110 and the second isolation liner 120 may include different materials. For example, the second device isolation layer 140 may include a material (e.g., tonen silazene (TOSZ)) having excellent gap-fill properties. For example, the first device isolation layer 130 may be a layer formed using a deposition process (e.g., an atomic layer deposition (ALD) process). For some examples, the first device isolation layer 130 and the second device isolation layer 140 may be in contact with each other without an interface therebetween. For certain examples, an interface may exist between the first device isolation layer 130 and the second device isolation layer 140.

Component(s) and a structure of each of the device isolation patterns may be changed depending on widths of the cell trench region CAT1 and CAT2, the peripheral trench region PAT1, PAT2 and PAT3 and the boundary trench region BAT, thicknesses of the first and second isolation liners 110 and 120 and thicknesses of the first and second device isolation layers 130 and 140. For example, even though the widths of two trench regions are equal to each other, the component(s) and the structure in each of the trench regions may be changed depending on the thicknesses of the first and second isolation liners 110 and 120 and the thicknesses of the first and second device isolation layers 130 and 140. Thus, in the present specification, a kind of the trench region may be determined depending on the component(s) and the structure in each of the trench regions regardless of a size or magnitude of the width of the trench region.

Hereinafter, features and components of the device isolation pattern in each of the cell region CR, the peripheral region PR and the boundary region BR will be described in more detail.

Referring to FIGS. 2 and 3A, the boundary device isolation pattern BI may include the first isolation liner 110, the second isolation liner 120, the first device isolation layer 130 and the second device isolation layer 140 in the boundary trench region BAT. More particularly, the first isolation liner 110, the second isolation liner 120 and the first device isolation layer 130 may sequentially cover, overlap, or be on an inner surface of the boundary trench region BAT. For example, the first isolation liner 110, the second isolation liner 120 and the first device isolation layer 130 may sequentially and conformally cover, overlap or be on the inner surface of the boundary trench region BAT. The second device isolation layer 140 may be disposed on the first device isolation layer 130 to at least partially or fully fill or be in the boundary trench region BAT. For example, the second device isolation layer 140 may fill a remaining region of the boundary trench region BAT, in which the first isolation liner 110, the second isolation liner 120 and the first device isolation layer 130 are not provided.

The peripheral device isolation pattern PI1, PI2 and PI3 may include a first peripheral device isolation pattern PI1 in a first peripheral trench region PAT1, a second peripheral device isolation pattern PI2 in a second peripheral trench region PAT2, and a third peripheral device isolation pattern PI3 in a third peripheral trench region PAT3. A top surface ACTa of the peripheral active pattern ACTp may be located at a first height or first level LV1, and widths of the first peripheral trench region PAT1, the second peripheral trench region PAT2 and the third peripheral trench region PAT3 at the first level LV1 may be different from each other. For example, at the first height or first level LV1, a width W2 of the second peripheral trench region PAT2 may be less than a width W1 of the first peripheral trench region PAT1 and may be greater than a width W3 of the third peripheral trench region PAT3. For certain examples, at the first level LV1, the width W2 of the second peripheral trench region PAT2 may be less than a width W4 of the boundary trench region BAT. Since the first to third peripheral trench regions PAT1, PAT2 and PAT3 have different widths, components and structures of the first to third peripheral device isolation patterns PI1, PI2 and PI3 provided therein may also be different from each other.

The first peripheral device isolation pattern PI1 may include the first isolation liner 110, the second isolation liner 120, the first device isolation layer 130, and the second device isolation layer 140. More particularly, the first isolation liner 110, the second isolation liner 120 and the first device isolation layer 130 may sequentially cover, overlap, or be on an inner surface of the first peripheral trench region PAT1. For example, the first isolation liner 110, the second isolation liner 120 and the first device isolation layer 130 may sequentially and conformally cover, overlap, or be on the inner surface of the first peripheral trench region PAT1. The second device isolation layer 140 may be disposed on the first device isolation layer 130 to at least partially or fully fill or be in the first peripheral trench region PAT1. For example, the second device isolation layer 140 may fill a remaining region of the first peripheral trench region PAT1, in which the first isolation liner 110, the second isolation liner 120 and the first device isolation layer 130 are not provided. For example, the second device isolation layer 140 in the first peripheral trench region PAT1 may not include a seam therein.

The second peripheral device isolation pattern PI2 may include the first isolation liner 110, the second isolation liner 120, and the first device isolation layer 130. More particularly, the first isolation liner 110 and the second isolation liner 120 may sequentially cover, overlap, or be on an inner surface of the second peripheral trench region PAT2. For example, the first isolation liner 110 and the second isolation liner 120 may sequentially and conformally cover, overlap, or be on the inner surface of the second peripheral trench region PAT2. The first device isolation layer 130 may be disposed on the second isolation liner 120 to fill the second peripheral trench region PAT2. For example, the first device isolation layer 130 may at least partially or fully fill or be in a remaining region of the second peripheral trench region PAT2, in which the first isolation liner 110 and the second isolation liner 120 are not provided.

The first device isolation layer 130 in the second peripheral trench region PAT2 may include a seam SM therein. For example, the first device isolation layer 130 may be formed by the deposition process, and thus the seam SM may be a boundary formed by contact of the first device isolation layers 130 deposited on both inner side surfaces of the second peripheral trench region PAT2. In some embodiments, the seam SM may include an empty space (e.g., a void). A shape, a position and the number of the seam SM may be various without limitations. For some examples, the seam SM may be locally disposed in the first device isolation layer 130 and may be disconnected from the outside. For certain examples, an upper portion of the seam SM may be exposed from the first device isolation layer 130 to the outside.

The second device isolation layer 140 may not be provided in the second peripheral trench region PAT2. For example, the second peripheral device isolation pattern PI2 may not include the second device isolation layer 140.

The third peripheral device isolation pattern PI3 may include the first isolation liner 110 and the second isolation liner 120. More particularly, the first isolation liner 110 may cover, overlap, or be on an inner surface of the third peripheral trench region PAT3. For example, the first isolation liner 110 may conformally cover, overlap, or be on the inner surface of the third peripheral trench region PAT3. The second isolation liner 120 may be disposed on the first isolation liner 110 to fill the third peripheral trench region PAT3. For example, the second isolation liner 120 may at least partially or fully fill a remaining region of the third peripheral trench region PAT3, in which the first isolation liner 110 is not provided.

The first device isolation layer 130 and the second device isolation layer 140 may not be provided in the third peripheral trench region PAT3. For example, the third peripheral device isolation pattern PI3 may not include the first device isolation layer 130 and the second device isolation layer 140.

Even though not shown in the drawings, a fourth peripheral trench region and a fourth peripheral device isolation pattern filling the fourth peripheral trench region may further be provided on the peripheral region PR. The fourth peripheral device isolation pattern may include the first isolation liner 110. For example, the fourth peripheral device isolation pattern may be formed of the first isolation liner 110, and the first isolation liner 110 may completely fill the fourth peripheral trench region. At the first height or first level LV1, a width of the fourth peripheral trench region may be less than the width W3 of the third peripheral trench region PAT3.

Upper portions of the peripheral device isolation pattern PI1, PI2 and PI3 and the boundary device isolation pattern BI may be recessed, and isolation recess regions SR may be provided thereon. For example, an upper portion of the second isolation liner 120 may be recessed less than upper portions of the first isolation liner 110, the first device isolation layer 130 and the second device isolation layer 140 and may protrude into the isolation recess region SR.

A peripheral word line PWL may be disposed on the peripheral active pattern ACTp. The peripheral active pattern ACTp may include a pair of dopant regions therein, and the peripheral word line PWL may intersect the peripheral active pattern ACTp between the pair of dopant regions when viewed in a plan view. The peripheral word line PWL may include a plurality of patterns sequentially stacked on the peripheral active pattern ACTp, and peripheral spacers covering or overlapping both side surfaces of the plurality of patterns. For example, the peripheral word line PWL may include a peripheral dielectric pattern 306, a peripheral poly-silicon pattern **310*p*, a peripheral ohmic pattern 320*p*, a peripheral electrode pattern BLp and a peripheral capping pattern 350*p* which are sequentially stacked, and a pair of peripheral spacers 355** covering, overlapping, or on both side surfaces of the patterns.

The peripheral dielectric pattern 306 may include at least one of silicon oxide or a high-k dielectric material. The peripheral poly-silicon pattern **310*p*, the peripheral ohmic pattern 320*p* and the peripheral electrode pattern BLp may include the same materials as a poly-silicon pattern 310 described later, a first ohmic pattern 320 described later and a bit line BL described later on the cell region CR, respectively. The peripheral capping pattern 350***p* may include the same material as at least one of materials included in a bit line capping pattern 350 described later. The peripheral spacer 355 may include at least one of silicon oxide or silicon nitride and may be a single layer or a composite layer.

An interlayer insulating layer IL may cover, overlap, or be on the peripheral active pattern ACTp, the peripheral device isolation pattern PI1, PI2 and PI3 and the peripheral word line PWL on the peripheral region PR. The interlayer insulating layer IL may further cover, overlap, or be on the boundary device isolation pattern BI on the boundary region BR. The interlayer insulating layer IL may include an insulating material. For example, the interlayer insulating layer IL may include at least one of silicon oxide, silicon nitride, TEOS, or a low-k dielectric material. For example, the interlayer insulating layer IL may be a single layer formed of a single material or a composite layer including two or more materials. Even though not shown in the drawings, conductive structures may penetrate the interlayer insulating layer IL and may be electrically connected to the peripheral active pattern ACTp and the peripheral word line PWL, respectively.

Referring to FIGS. 2, 3B and 3C, the cell device isolation pattern CI1 and CI2 may include a first cell device isolation pattern CI1 in a first cell trench region CAT1, and a second cell device isolation pattern CI2 in a second cell trench region CAT2. A bottom surface of a word line WL described later may be located at a second height or second level LV2, and widths of the first cell trench region CAT1 and the second cell trench region CAT2 at the second height or second level LV2 may be different from each other. For example, at the second height or second level LV2, the width of the second cell trench region CAT2 may be less than the width of the first cell trench region CAT1. Since the first and second cell trench regions CAT1 and CAT2 have different widths, components and structures of the first and second cell device isolation patterns CI1 and CI2 therein may also be different from each other.

The first cell device isolation pattern CI1 may include the first isolation liner 110 and the second isolation liner 120. More particularly, the first isolation liner 110 may cover, overlap, or be on an inner surface of the first cell trench region CAT1. For example, the first isolation liner 110 may conformally cover, overlap, or be on the inner surface of the first cell trench region CAT1. The second isolation liner 120 may be disposed on the first isolation liner 110 to at least partially fill or be in the first cell trench region CAT1. For example, the second isolation liner 120 may at least partially fill or be in a remaining region of the first cell trench region CAT1, in which the first isolation liner 110 is not provided.

For example, the first device isolation layer 130 and the second device isolation layer 140 may not be provided in the first cell trench region CAT1. For example, the first cell device isolation pattern CI1 may not include the first device isolation layer 130 and the second device isolation layer 140.

The second cell device isolation pattern CI2 may include the first isolation liner 110. For example, the second cell device isolation pattern CI2 may be formed of the first isolation liner 110, and the first isolation liner 110 may completely fill a lower portion of the second cell trench region CAT2.

For example, the second isolation liner 120, the first device isolation layer 130 and the second device isolation layer 140 may not be provided in the second cell trench region CAT2. For example, the second cell device isolation pattern CI2 may not include the second isolation liner 120, the first device isolation layer 130 and the second device isolation layer 140.

A word line WL may intersect the cell active patterns ACTc on the cell region CR. For example, the word line WL may intersect the cell active patterns ACTc and the cell device isolation pattern CI1 and CI2 in the first direction D1. The word line WL may be provided in plurality. The plurality of word lines WL may be spaced apart from each other in the second direction D2. For example, a pair of the word lines WL adjacent to each other in the second direction D2 may intersect each of the cell active patterns ACTc.

For example, each of the word lines WL may include a gate electrode GE, a gate insulating pattern GI, and a gate capping pattern GC. The gate electrode GE may intersect the cell active pattern ACTc and the cell device isolation pattern CI1 and CI2 in the first direction D1. The gate insulating pattern GI may be disposed between the gate electrode GE and the cell active pattern ACTc. The gate capping pattern GC may cover, overlap, or be on a top surface of the gate electrode GE. For example, the gate electrode GE may include a metal material (e.g., Ti, Mo, W, Cu, Al, Ta, Ru, or Ir). For example, the gate insulating pattern GI may include at least one of silicon oxide or a high-k dielectric material. In the present specification, the high-k dielectric material may be defined as a material having a dielectric constant higher than that of silicon oxide. For example, the gate capping pattern GC may include silicon nitride.

A buffer pattern 210 may be disposed on the substrate 100. The buffer pattern 210 may cover, overlap, or be on the cell active patterns ACTc and the cell device isolation patterns CI1 and CI2. For example, the buffer pattern 210 may include at least one of silicon oxide, silicon nitride, silicon oxynitride, or any combination thereof. The buffer pattern 210 may be a single layer formed of a single material or a composite layer including two or more materials.

A bit line contact DC may be provided on each of the cell active patterns ACTc and may be provided in plurality. For example, the bit line contacts DC may be provided on the center portions CA of the cell active patterns ACTc. Each of the bit line contacts DC may be electrically connected to a corresponding one of the center portions CA of the cell active patterns ACTc. The bit line contacts DC may be spaced apart from each other in the first and/or second directions D1 and D2. Each of the bit line contacts DC may be disposed between a corresponding one of the cell active patterns ACTc and a corresponding one of bit lines BL described later. Each of the bit line contacts DC may electrically connect the corresponding one of the bit lines BL to the corresponding one of the center portions CA.

The bit line contacts DC may be disposed in first recess regions RS1, respectively. The first recess regions RS1 may be provided in upper portions of the cell active patterns ACTc and an upper portion of the cell device isolation pattern CI1 and CI2 adjacent to the upper portions of the cell active patterns ACTc. The first recess regions RS1 may be spaced apart from each other in the first and second directions D1 and D2.

A filling insulation pattern 250 may fill or be in each of the first recess regions RS1. The filling insulation pattern 250 may fill or be in the inside of the first recess region RS1. For example, the filling insulation pattern 250 may cover, overlap, or be on an inner surface of the first recess region RS1, and at least a portion of a side surface of the bit line contact DC (e.g., at least a portion of the side surface of the bit line contact DC in the first recess region RS1). The filling insulation pattern 250 may include at least one of silicon oxide, silicon nitride, or a combination thereof. The filling insulation pattern 250 may be a single layer formed of a single material or a composite layer including two or more materials.

The bit line BL may be provided on the bit line contact DC. The bit line BL may extend in the second direction D2. The bit line BL may be disposed on the bit line contacts DC arranged in a line in the second direction D2. The bit line BL may be provided in plurality. The bit lines BL may be spaced apart from each other in the first direction D1. The bit line BL may include a metal material. For example, the bit line BL may include a metal material (e.g., Ti, Mo, W, Cu, Al, Ta, Ru, or Ir).

A poly-silicon pattern 310 may be provided between the bit line BL and the buffer pattern 210. The poly-silicon pattern 310 may be provided in plurality. For example, a top surface of the poly-silicon pattern 310 may be located at substantially the same height as a top surface of the bit line contact DC and may be substantially coplanar with the top surface of the bit line contact DC. The poly-silicon pattern 310 may include poly-silicon doped with dopants.

A first ohmic pattern 320 may be disposed between the bit line BL and the bit line contact DC and between the bit line BL and the poly-silicon pattern 310. The first ohmic pattern 320 may extend in the second direction D2 along the bit line BL. The first ohmic pattern 320 may be provided in plurality. The plurality of first ohmic patterns 320 may be spaced apart from each other in the first direction D1. The first ohmic pattern 320 may include a metal silicide. A first barrier pattern (not shown) may be further disposed between the bit line BL and the bit line contact DC and between the bit line BL and the poly-silicon pattern 310. The first barrier pattern may include a conductive metal nitride (e.g., a nitride of Ti, Mo, W, Cu, Al, Ta, Ru, or Ir).

A bit line capping pattern 350 may be provided on a top surface of the bit line BL. The bit line capping pattern 350 may extend in the second direction D2 on the top surface of the bit line BL. The bit line capping pattern 350 may be provided in plurality. The plurality of bit line capping patterns 350 may be spaced apart from each other in the first direction D1. The bit line capping pattern 350 may vertically overlap with the bit line BL. The bit line capping pattern 350 may be formed of a single layer or a plurality of layers. For example, the bit line capping pattern 350 may include a first capping pattern, a second capping pattern and a third capping pattern, which are sequentially stacked. The first to third capping patterns may include the same material or different materials, and for example, each of the first to third capping patterns may include silicon nitride. In some embodiments, the bit line capping pattern 350 may include four or more stacked capping patterns.

A bit line spacer 360 may be provided on a side surface of the bit line BL and a side surface of the bit line capping pattern 350. The bit line spacer 360 may cover, overlap, or be on the side surface of the bit line BL and the side surface of the bit line capping pattern 350. The bit line spacer 360 may extend in the second direction D2 on the side surface of the bit line BL.

The bit line spacer 360 may include a plurality of spacers. For example, the bit line spacer 360 may include a first spacer 362, a second spacer 364, and a third spacer 366. The third spacer 366 may be provided on the side surface of the bit line BL and the side surface of the bit line capping pattern 350. The first spacer 362 may be disposed between the bit line BL and the third spacer 366 and between the bit line capping pattern 350 and the third spacer 366. The second spacer 364 may be disposed between the first spacer 362 and the third spacer 366. For example, the first to third spacers 362, 364 and 366 may each independently include at least one of silicon nitride, silicon oxide, silicon oxynitride, or a combination thereof. In some embodiments, the second spacer 364 may include an air gap separating the first and third spacers 362 and 366 from each other.

For example, a capping spacer 370 may be located on the bit line spacer 360. The capping spacer 370 may cover, overlap, or be on an upper portion of a side surface of the bit line spacer 360. For example, the capping spacer 370 may include silicon nitride. However, embodiments of the inventive concepts are not limited thereto, and in certain embodiments, the capping spacer 370 may be omitted.

A storage node contact BC may be provided between the bit lines BL adjacent to each other. For example, the storage node contact BC may be disposed between the bit line spacers 360 adjacent to each other. The storage node contact BC may be provided in plurality. The plurality of storage node contacts BC may be spaced apart from each other in the first and second directions D1 and D2. The storage node contacts BC may be spaced apart from each other in the second direction D2 by a fence pattern FN on the word line WL. The fence pattern FN may be provided between the bit lines BL adjacent to each other. The fence pattern FN may be provided in plurality. The fence patterns FN may be spaced apart from each other in the first and second directions D1 and D2. The fence patterns FN adjacent to each other in the first direction D1 may be spaced apart from each other with the bit line BL interposed therebetween. The fence patterns FN adjacent to each other in the second direction D2 may be spaced apart from each other with the storage node contact BC interposed therebetween. The storage node contacts BC and the fence patterns FN may be alternately arranged along the second direction D2. For example, the fence patterns FN may include at least one of silicon oxide, silicon nitride, silicon oxycarbide, or silicon oxy-carbonitride.

The storage node contacts BC may fill second recess regions RS2 provided on the edge portions EA of the cell active patterns ACTc, respectively. Each of the storage node contacts BC may be electrically connected to a corresponding one of the edge portions EA. The storage node contact BC may include at least one of poly-silicon doped with dopants, undoped poly-silicon, a metal material, or any combination thereof.

A second barrier pattern 410 may conformally cover, overlap, or be on the bit line spacer 360, the fence pattern FN, and the storage node contact BC. The second barrier pattern 410 may include a conductive metal nitride (e.g., a nitride of Ti, Mo, W, Cu, Al, Ta, Ru, or Ir). A second ohmic pattern (not shown) may be disposed between the second barrier pattern 410 and the storage node contact BC. The second ohmic pattern may include a metal silicide.

A landing pad LP may be provided on the storage node contact BC. The landing pad LP may be provided in plurality. The plurality of landing pads LP may be spaced apart from each other in the first and second directions D1 and D2. Each of the landing pads LP may be electrically connected to a corresponding one of the storage node contacts BC. The landing pad LP may cover, overlap, or be on a top surface of the bit line capping pattern 350. For example, a lower region of the landing pad LP may vertically overlap with the storage node contact BC, and an upper region of the landing pad LP may be shifted from the lower region in the first direction D1. The landing pad LP may include a metal material (e.g., Ti, Mo, W, Cu, Al, Ta, Ru, or Ir).

A filling pattern 440 may surround the landing pad LP when viewed in a plan view. The filling pattern 440 may be disposed between the landing pads LP adjacent to each other. The filling pattern 440 may have a mesh shape including holes penetrated by the landing pads LP, when viewed in a plan view. For example, the filling pattern 440 may include at least one of silicon nitride, silicon oxide, silicon oxynitride, or any combination thereof. In some embodiments, the filling pattern 440 may include an empty space (i.e., an air gap) including air.

A data storage pattern DSP may be provided on the landing pad LP. The data storage pattern DSP may be provided in plurality. The plurality of data storage patterns DSP may be spaced apart from each other in the first and second directions D1 and D2. Each of the data storage patterns DSP may be electrically connected to a corresponding one of the edge portions EA through a corresponding one of the landing pads LP and a corresponding one of the storage node contacts BC.

For some examples, the data storage pattern DSP may be a capacitor including a lower electrode, a dielectric layer and an upper electrode. In this case, the semiconductor device according to the inventive concepts may be a dynamic random access memory (DRAM) device. For certain examples, the data storage pattern DSP may include a magnetic tunnel junction pattern. In this case, the semiconductor device according to the inventive concepts may be a magnetic random access memory (MRAM) device. For certain examples, the data storage pattern DSP may include a phase-change material or a variable resistance material. In this case, the semiconductor device according to the inventive concepts may be a phase-change random access memory (PRAM) device or a resistive random access memory (ReRAM) device. However, embodiments of the inventive concepts are not limited thereto, and in certain embodiments, the data storage pattern DSP may include at least one of other various structures and/or materials capable of storing data.

Hereinafter, a method of manufacturing a semiconductor device according to some embodiments of the inventive concepts will be described with reference to FIGS. 4A, 4B, 4C, 5A, 5B, 5C, 6A, 6B, 6C, 7A, 7B, and 7C. However, the descriptions to the same features as mentioned above will be omitted and differences from the aforementioned features will be mainly described, for the purpose of ease and convenience in explanation.

FIGS. 4A, 4B, 4C, 5A, 5B, 5C, 6A, 6B, 6C, 7A, 7B, and 7C are cross-sectional views illustrating a method of manufacturing a semiconductor device according to some embodiments of the inventive concepts. More particularly, FIGS. 4A, 5A, 6A and 7A are cross-sectional views corresponding to the lines A-A', B-B' and C-C' of FIG. 2. FIGS. 4B, 5B, 6B and 7B are cross-sectional views corresponding to the line D-D' of FIG. 2. FIGS. 4C, 5C, 6C and 7C are cross-sectional views corresponding to the line E-E' of FIG. 2.

Referring to FIGS. 2 and 4A to 4C, a substrate 100 including a cell region CR, a peripheral region PR and a boundary region BR may be prepared. A removal process may be performed on the substrate 100 to form a cell trench region CAT1 and CAT2 on the cell region CR, a peripheral trench region PAT1, PAT2 and PAT3 on the peripheral region PR, and a boundary trench region BAT on the boundary region BR. Cell active patterns ACTc may be defined by the cell trench region CAT1 and CAT2. Peripheral active patterns ACTp may be defined by the peripheral trench region PAT1, PAT2 and PAT3.

The removal process may include forming mask patterns on the substrate 100 by using an exposure process, and etching the substrate 100 using the mask patterns as etch masks. In some embodiments, the exposure process and the etching process may be alternately repeated a plurality of times. For example, the exposure process may be an exposure process using extreme ultraviolet (EUV) light.

A first isolation liner 110 may be formed on an entire top surface of the substrate 100. For example, the first isolation liner 110 may be formed on the cell region CR, the peripheral region PR and the boundary region BR of the substrate 100 and may cover, overlap, or be on top surfaces of the cell active patterns ACTc and the peripheral active patterns ACTp.

The first isolation liner 110 may conformally cover, overlap, or be on an inner surface of a first cell trench region CAT1 on the cell region CR and may fill a second cell trench region CAT2 on the cell region CR. The first isolation liner 110 may conformally cover, overlap, or be on an inner surface of the boundary trench region BAT on the boundary region BR. The first isolation liner 110 may conformally cover, overlap, or be on an inner surface of each of first to third peripheral trench regions PAT1, PAT2 and PAT3 on the peripheral region PR. In some embodiments, even though not shown in the drawings, the first isolation liner 110 may fill a fourth peripheral trench region on the peripheral region PR. For example, the first isolation liner 110 may completely fill the second cell trench region CAT2 and the fourth peripheral trench region.

A second isolation liner 120 may be formed on an entire top surface of the substrate 100. For example, the second isolation liner 120 may be formed on the cell region CR, the peripheral region PR and the boundary region BR of the substrate 100 and may cover, overlap, or be on the first isolation liner 110 on the top surfaces of the cell active patterns ACTc and the peripheral active patterns ACTp.

The second isolation liner 120 may fill the first cell trench region CAT1 on the cell region CR. For example, the second isolation liner 120 may fill a remaining region of the first cell trench region CAT1, in which the first isolation liner 110 is not provided. The second isolation liner 120 may conformally cover, overlap, or be on the inner surface of the boundary trench region BAT on the boundary region BR. The second isolation liner 120 may conformally cover, overlap, or be on the inner surface of each of the first and second peripheral trench regions PAT1 and PAT2 on the peripheral region PR and may fill the third peripheral trench region PAT3 on the peripheral region PR. For example, the second isolation liner 120 may fill a remaining region of the third peripheral trench region PAT3, in which the first isolation liner 110 is not provided. For example, the second isolation liner 120 may not be provided in the second cell trench region CAT2. For example, the first isolation liner 110 and the second isolation liner 120 may completely fill the first cell trench region CAT1 and the third peripheral trench region PAT3.

The first isolation liner 110 and the second isolation liner 120 may be formed using a deposition process. For example, the deposition process may include a physical vapor deposition (PVD) process, a chemical vapor deposition (CVD) process, or an atomic layer deposition (ALD) process.

Referring to FIGS. 2 and 5A to 5C, a first device isolation layer 130 may be formed on an entire top surface of the substrate 100. For example, the first device isolation layer 130 may be formed on the cell region CR, the peripheral region PR and the boundary region BR of the substrate 100 and may cover, overlap, or be on the second isolation liner

120 on the top surfaces of the cell active patterns ACTc and the peripheral active patterns ACTp.

The first device isolation layer 130 may conformally cover, overlap, or be on the inner surface of the boundary trench region BAT on the boundary region BR. The first device isolation layer 130 may conformally cover, overlap, or be on the inner surface of the first peripheral trench region PAT1 on the peripheral region PR and may fill the second peripheral trench region PAT2 on the peripheral region PR. For example, the first device isolation layer 130 may fill a remaining region of the second peripheral trench region PAT2, in which the first and second isolation liners 110 and 120 are not provided. For example, the first device isolation layer 130 may not be provided in the first and second cell trench regions CAT1 and CAT2 and the third peripheral trench region PAT3. For example, the first and second isolation liners 110 and 120 and the first device isolation layer 130 may completely fill the second peripheral trench region PAT2.

The first device isolation layer 130 may be formed using a deposition process. For example, the deposition process may include a physical vapor deposition (PVD) process, a chemical vapor deposition (CVD) process, or an atomic layer deposition (ALD) process. For example, the first device isolation layer 130 may be formed using a low-temperature ALD process. The low-temperature ALD process may be performed at a temperature of 50° C. to 300° C.

Since the first device isolation layer 130 is formed using the deposition process, the first device isolation layer 130 may include or not include a seam SM therein, depending on a width of the trench region. For example, the inside of the first peripheral trench region PAT1 having a wide width may not be filled with the first device isolation layer 130, and thus the first device isolation layer 130 may not include the seam SM in the first peripheral trench region PAT1. Likewise, the first device isolation layer 130 may not include the seam SM in the boundary trench region BAT having a wide width. On the contrary, the inside of the second peripheral trench region PAT2 having a width less than those of the first peripheral trench region PAT1 and the boundary trench region BAT may be filled with the first device isolation layer 130. Thus, the seam SM may be formed at a boundary of sidewalls of the first device isolation layers 130 deposited from both inner side surfaces of the second peripheral trench region PAT2.

A second device isolation layer 140 may be formed on an entire top surface of the substrate 100. For example, the second device isolation layer 140 may be formed on the cell region CR, the peripheral region PR and the boundary region BR of the substrate 100 and may cover, overlap, or be on the first device isolation layer 130 on the top surfaces of the cell active patterns ACTc and the peripheral active patterns ACTp.

The second device isolation layer 140 may fill or at least partially fill the boundary trench region BAT on the boundary region BR and may fill or at least partially fill the first peripheral trench region PAT1 on the peripheral region PR. For example, the second device isolation layer 140 may fill a remaining region of each of the boundary trench region BAT and the first peripheral trench region PAT1, in which the first and second isolation liners 110 and 120 and the first device isolation layer 130 are not provided. For example, the second device isolation layer 140 may not be provided in the first and second cell trench regions CAT1 and CAT2 and the second and third peripheral trench regions PAT2 and PAT3. For example, the first and second isolation liners 110 and 120 and the first and second device isolation layers 130 and 140 may completely fill the boundary trench region BAT and the first peripheral trench region PAT1.

The second device isolation layer 140 may include a material having excellent gap-fill properties and thus may fill the boundary trench region BAT and the first peripheral trench region PAT1 which have relatively wide widths. The second device isolation layer 140 may have flowability to satisfy the gap-fill properties. The formation of the second device isolation layer 140 may include forming the second device isolation layer 140 having the flowability on an entire top surface of the substrate 100 by a spin coating process. Thus, the second device isolation layer 140 may not include a seam therein, unlike the first device isolation layer 130.

After the formation of the second device isolation layer 140, a densification process may be performed on the second device isolation layer 140. For example, the densification process may be performed immediately after the formation of the second device isolation layer 140, but embodiments of the inventive concepts are not limited thereto. In certain embodiments, additional processes may be performed after the formation of the second device isolation layer 140, and then, the densification process may be performed. The second device isolation layer 140 may be hardened by the densification process. In this densification process, a volume of the second device isolation layer 140 may be reduced, and thus tensile stress may be applied to the cell active patterns ACTc and the peripheral active patterns ACTp.

According to the inventive concepts, the first device isolation layer 130 may be formed before the formation of the second device isolation layer 140. Since the first device isolation layer 130 is formed, it is possible to reduce the tensile stress generated by the reduction in the volume of the second device isolation layer 140. Since the tensile stress is reduced, it is possible to inhibit or prevent the cell active patterns ACTc adjacent to the boundary region BR from being bent toward the boundary region BR. As a result, process failure of the semiconductor device may be reduced or minimized.

Referring to FIGS. 2 and 6A to 6C, a removal process may be performed on the first device isolation layer 130 and the second device isolation layer 140. For example, upper portions of the first device isolation layer 130 and the second device isolation layer 140 may be removed by the removal process. After the removal process is performed, other portions of the first device isolation layer 130 and the second device isolation layer 140 may remain in the trench regions.

For example, the first device isolation layer 130 and the second device isolation layer 140 may include a material having an etch selectivity with respect to the second isolation liner 120, and the removal process may be performed by a wet etching process using the etch selectivity. For example, the upper portions of the first device isolation layer 130 and the second device isolation layer 140 may be recessed by the removal process. For example, the upper portions of the first device isolation layer 130 and the second device isolation layer 140 may be recessed deeper as the width of the trench region increases, but embodiments of the inventive concepts are not limited thereto.

Referring to FIGS. 2 and 7A to 7C, a word line WL may be formed on the cell region CR. The word line WL may be formed to intersect the cell active pattern ACTc. The formation of the word line WL may include forming a mask pattern on the cell active pattern ACTc, performing an anisotropic etching process using the mask pattern as an etch mask to form a word line trench WTR, and filling the word line trench WTR with the word line WL. A plurality of the word lines WL may extend in the first direction D1 in the cell active patterns ACTc and may be spaced apart from each other in the second direction D2. For example, the filling of the word line trench WTR with the word line WL may include conformally depositing a gate insulating pattern GI on an inner surface of the word line trench WTR, filling the word line trench WTR with a conductive layer, performing an etch-back process and/or a polishing process on the conductive layer to form a gate electrode GE, and forming a gate capping pattern GC filling a remaining portion of the word line trench WTR on the gate electrode GE.

The first and second isolation liners 110 and 120 on the cell active patterns ACTc and the peripheral active patterns ACTp may be removed. Thus, the top surfaces of the cell active patterns ACTc and the peripheral active patterns ACTp may be exposed, but embodiments of the inventive concepts are not limited thereto. Cell device isolation patterns CI1 and CI2, peripheral device isolation patterns PI1, PI2 and PI3 and a boundary device isolation pattern BI may be finally formed by the removal process. Isolation recess regions SR may be formed on the peripheral device isolation patterns PI1, PI2 and PI3 and the boundary device isolation pattern BI due to recesses formed in the removal process described with reference to FIGS. 6A to 6C. For example, the isolation recess regions SR may be formed deeper as widths of the peripheral trench regions PAT1, PAT2 and PAT3 and the boundary trench region BAT increase, but embodiments of the inventive concepts are not limited thereto.

Referring again to FIGS. 2 to 3C, a buffer layer (not shown) and a poly-silicon layer (not shown) may be formed to cover, overlap, or be on the cell active patterns ACTc and the cell device isolation pattern CI1 and CI2 on the cell region CR, and then, first recess regions RS1 may be formed on the cell active patterns ACTc and the cell device isolation pattern CI1 and CI2. When the first recess region RS1 is formed, the buffer layer and the poly-silicon layer may be partially removed to form a buffer pattern 210 and a poly-silicon pattern 310.

A bit line contact DC, a first ohmic pattern 320, a bit line BL and a bit line capping pattern 350 may be formed on the first recess region RS1. The formation of the bit line contact DC, the first ohmic pattern 320, the bit line BL and the bit line capping pattern 350 may include forming a bit line contact layer (not shown) filling the first recess region RS1, sequentially forming a first ohmic layer (not shown), a bit line layer (not shown) and a bit line capping layer (not shown) on the bit line contact layer, and etching the bit line contact layer, the first ohmic layer, the bit line layer and the bit line capping layer to form the bit line contact DC, the first ohmic pattern 320, the bit line BL and the bit line capping pattern 350. At this time, a portion of the poly-silicon pattern 310 may be further etched. In this process, a portion of an inner surface of the first recess region RS1 may be exposed again to the outside. In the process of forming the bit line BL, a first barrier pattern (not shown) may be additionally formed between the bit line BL and the bit line contact DC and between the bit line BL and the poly-silicon pattern 310.

A peripheral word line PWL may be formed on the peripheral active pattern ACTp. The formation of the peripheral word line PWL may include forming a peripheral dielectric layer (not shown), a peripheral poly-silicon layer (not shown), a peripheral ohmic layer (not shown), a peripheral electrode layer (not shown) and a peripheral capping layer (not shown), etching these layers to form a peripheral dielectric pattern 306, a peripheral poly-silicon pattern 310*p*, a peripheral ohmic pattern 320*p*, a peripheral electrode pattern BLp and a peripheral capping pattern 350*p*, and forming peripheral spacers 355. For example, the peripheral poly-silicon layer, the peripheral ohmic layer, the peripheral electrode layer and the peripheral capping layer may be formed together with the poly-silicon layer, the first ohmic layer, the bit line layer and the bit line capping layer, but embodiments of the inventive concepts are not limited thereto. Thereafter, an interlayer insulating layer IL may be formed to cover, overlap, or be on the peripheral active pattern ACTp and the peripheral word line PWL.

Thereafter, a filling insulation pattern 250 may be formed on the cell region CR to fill a remaining portion of the first recess region RS1. A bit line spacer 360 may be formed to cover, overlap, or be on a side surface of the bit line BL and a side surface of the bit line capping pattern 350. The formation of the bit line spacer 360 may include sequentially forming a first spacer 362, a second spacer 364 and a third spacer 366, which conformally cover, overlap, or be on the side surface of the bit line BL and the side surface of the bit line capping pattern 350.

Storage node contacts BC and fence patterns FN may be formed between the bit lines BL adjacent to each other. The storage node contacts BC and the fence patterns FN may be alternately arranged in the second direction D2. Before the formation of the storage node contacts BC, a second recess region RS2 may be formed on each of a pair of edge portions EA of the cell active pattern ACTc. Each of the storage node contacts BC may fill the second recess region RS2 and may be electrically connected to a corresponding edge portion EA in the second recess region RS2. The fence patterns FN may be formed to vertically overlap with the word lines WL. For example, the storage node contacts BC may be first formed, and then, the fence patterns FN may be formed between the storage node contacts BC. In some embodiments, the fence patterns FN may be first formed, and then, the storage node contacts BC may be formed between the fence patterns FN.

In the process of forming the storage node contacts BC, a portion of an upper portion of the bit line spacer 360 may be removed. Thus, a capping spacer 370 may further be formed at a position from which the portion of the bit line spacer 360 is removed. Thereafter, a second barrier pattern 410 may be formed to conformally cover, overlap, or be on the bit line spacer 360, the capping spacer 370 and the storage node contacts BC.

Landing pads LP may be formed on the storage node contacts BC. The formation of the landing pads LP may include sequentially forming a landing pad layer (not shown) and mask patterns (not shown) which cover, overlap, or are on top surfaces of the storage node contacts BC, and dividing the landing pad layer into a plurality of the landing pads LP by an anisotropic etching process using the mask patterns as etch masks. A portion of the second barrier pattern 410, a portion of the bit line spacer 360 and a portion of the bit line capping pattern 350 may be etched by the anisotropic etching process, and they 410, 360 and 350 may be exposed to the outside. An upper portion of the landing pad LP may be shifted from the storage node contact BC in the first direction D1.

In some embodiments, the second spacer 364 may be exposed by the anisotropic etching process of the landing pad layer. An etching process may further be performed on the second spacer 364 through the exposed portion of the second spacer 364, and finally, the second spacer 364 may include an air gap. However, embodiments of the inventive concepts are not limited thereto.

Thereafter, a filling pattern 440 may be formed to cover, overlap, or be on the exposed portions and to surround each of the landing pads LP in a plan view, and a data storage pattern DSP may be formed on each of the landing pads LP.

According to the inventive concepts, it is possible to inhibit or prevent the cell active patterns adjacent to the boundary region from being bent toward the boundary region. As a result, process failure of the semiconductor device may be reduced or minimized.

While the embodiments of the inventive concepts have been particularly shown and described, it will be understood by one of ordinary skill in the art that variations in form and detail may be made therein without departing from the spirit and scope of the attached claims.

What is claimed is:

1. A semiconductor device comprising:

a substrate including a cell region and a peripheral region;

peripheral active patterns on the peripheral region on the substrate;

peripheral word lines on the peripheral active patterns;

a word line positioned on the cell region;

a bit line positioned on the cell region and extending in a direction intersecting the word line;

a first peripheral trench region and a second peripheral trench region which are adjacent the peripheral active patterns;

a first isolation liner on inner surfaces of the first and second peripheral trench regions;

a second isolation liner on the first isolation liner in the first and second peripheral trench regions; and a device isolation layer on the second isolation liner in the first and second peripheral trench regions, wherein the device isolation layer includes a seam therein in the second peripheral trench region, and wherein a width of the first peripheral trench region is greater than a width of the second peripheral trench region at a first height corresponding to top surfaces of the peripheral active patterns with respect to the substrate.

2. The semiconductor device of claim 1, wherein the device isolation layer includes at least one of silicon oxide or silicon nitride.

3. The semiconductor device of claim 1, wherein the first isolation liner is conformally on the inner surfaces of the first and second peripheral trench regions, and wherein the second isolation liner is conformally on the first isolation liner in the first and second peripheral trench regions.

4. The semiconductor device of claim 1, wherein the first isolation liner and the second isolation liner include different materials.

5. The semiconductor device of claim 1, wherein a portion of the device isolation layer that is in the first peripheral trench region comprises a continuous portion that is free of a seam therein.

6. The semiconductor device of claim 1, wherein the device isolation layer includes a first device isolation layer and a second device isolation layer, wherein the first device isolation layer is on the second isolation liner in the first peripheral trench region and is in the second peripheral trench region, and wherein the second device isolation layer is in the first peripheral trench region.

7. The semiconductor device of claim 6, wherein the first device isolation layer and the second device isolation layer are integrated without an interface therebetween.

8. The semiconductor device of claim 1, further comprising:

a third peripheral trench region between ones of the peripheral active patterns, wherein the first isolation liner further is on an inner surface of the third peripheral trench region, and wherein the second isolation liner is in the third peripheral trench region on the first isolation liner.

9. The semiconductor device of claim 8, wherein a width of the third peripheral trench region is less than the width of the second peripheral trench region at the first height.

10. The semiconductor device of claim 8, wherein the device isolation layer does not extend into the third peripheral trench region.

11. A semiconductor device comprising:

a substrate including a cell region and a peripheral region;

peripheral active patterns on the peripheral region on the substrate;

peripheral word lines on the peripheral active patterns;

a word line positioned on the cell region;

a bit line positioned on the cell region and extending in a direction intersecting the word line;

a first peripheral trench region and a second peripheral trench region adjacent the peripheral active patterns;

a first isolation liner on inner surfaces of the first and second peripheral trench regions;

a second isolation liner on the first isolation liner in the first and second peripheral trench regions;

a first device isolation layer on the second isolation liner in the first peripheral trench region and in the second peripheral trench region; and a second device isolation layer in the first peripheral trench region.

12. The semiconductor device of claim 11, wherein the first device isolation layer includes a seam therein in the second peripheral trench region.

13. The semiconductor device of claim 11, wherein the second device isolation layer is continuous and is free of a seam therein.

14. The semiconductor device of claim 11, wherein the second device isolation layer does not extend into the second peripheral trench region.

15. The semiconductor device of claim 11, wherein the first device isolation layer includes at least one of silicon oxide or silicon nitride.

16. A semiconductor device comprising:

a substrate including a cell region and a peripheral region;

a cell active pattern on the cell region, the cell active pattern including a center portion and an edge portion;

a word line intersecting the cell active pattern;

a bit line on the center portion of the cell active pattern and that extends in a direction intersecting the word line;

a storage node contact on the edge portion of the cell active pattern;

a landing pad on the storage node contact;

a data storage pattern on the landing pad;

peripheral active patterns on the peripheral region;

peripheral word lines on the peripheral active patterns;

a first peripheral trench region and a second peripheral trench region adjacent the peripheral active patterns;

a first isolation liner on inner surfaces of the first and second peripheral trench regions;

a second isolation liner on the first isolation liner in the first and second peripheral trench regions; and a device isolation layer on the second isolation liner in the first and second peripheral trench regions, wherein the device isolation layer includes a seam therein in the second peripheral trench region, and wherein a width of the first peripheral trench region is greater than a width of the second peripheral trench region at a first height corresponding to top surfaces of the peripheral active patterns with respect to the substrate.

17. The semiconductor device of claim 16, wherein the substrate further includes a boundary region between the cell region and the peripheral region, and wherein the semiconductor device further comprises:

a boundary trench region on the boundary region between the cell active pattern and the peripheral active patterns, wherein the first isolation liner and the second isolation liner sequentially overlap an inner surface of the boundary trench region, and wherein the device isolation layer is in the boundary trench region on the second isolation liner.

18. The semiconductor device of claim 17, wherein a width of the boundary trench region is greater than the width of the second peripheral trench region at the first height.

19. The semiconductor device of claim 17, wherein the device isolation layer is continuous and is free of a seam therein in the boundary trench region.

20. The semiconductor device of claim 16, further comprising:

a cell trench region adjacent the cell active pattern, wherein the device isolation layer does not extend into the cell trench region.

* * * * *